(12) United States Patent
Topping

(10) Patent No.: US 11,837,413 B2
(45) Date of Patent: Dec. 5, 2023

(54) ENERGY STORAGE DEVICE COMPRISING A GROOVE WITH CAPACITOR MATERIAL THEREIN

(71) Applicant: POWER ROLL LIMITED, Sunderland (GB)

(72) Inventor: Alexander John Topping, Alston (GB)

(73) Assignee: POWER ROLL LIMITED, Sunderland (GB)

(*) Notice: Subject to any disclaimer, the term of this patent is extended or adjusted under 35 U.S.C. 154(b) by 318 days.

(21) Appl. No.: 17/277,150

(22) PCT Filed: Sep. 24, 2019

(86) PCT No.: PCT/GB2019/052691
§ 371 (c)(1),
(2) Date: Mar. 17, 2021

(87) PCT Pub. No.: WO2020/065298
PCT Pub. Date: Apr. 2, 2020

(65) Prior Publication Data
US 2021/0375552 A1       Dec. 2, 2021

(30) Foreign Application Priority Data
Sep. 28, 2018   (GB) ...................... 1815843

(51) Int. Cl.
*H01G 4/38*      (2006.01)
*H01G 4/012*     (2006.01)
(Continued)

(52) U.S. Cl.
CPC .............. *H01G 4/38* (2013.01); *H01G 4/012* (2013.01); *H01G 4/32* (2013.01); *H01G 11/26* (2013.01)

(58) Field of Classification Search
CPC ............ H01G 4/32; H01G 4/012; H01G 4/38
See application file for complete search history.

(56) References Cited

U.S. PATENT DOCUMENTS

| 10,475,798 B2 * | 11/2019 | Lin .................... H01L 28/92 |
| 2005/0087838 A1 * | 4/2005 | Hsin ................... H01L 23/5223 257/532 |

(Continued)

FOREIGN PATENT DOCUMENTS

| GB | 2210462 A | 6/1989 |
| GB | 2555009 A | 4/2018 |

(Continued)

OTHER PUBLICATIONS

Indian Examination Report, Application No. 202137010600, dated Feb. 1, 2022, 6 pages.
(Continued)

*Primary Examiner* — David M Sinclair
(74) *Attorney, Agent, or Firm* — Husch Blackwell LLP

(57) ABSTRACT

The invention relates to an energy storage device (21) comprising a substrate with a groove (3) having a first and a second face (9a, 9b). A capacitor material (5) in the groove (3), the capacitor material having an upper surface (25). The first and the second face (9a, 9b) of the groove (3) each having a coat of electrically conductive material (7) wherein the coats of electrically conductive materials (7) on the first and second faces (9a, 9b) are electrically separated. And wherein, a non-insulating element (23) is configured to be electrically contactable with the upper surface (25) of the capacitor material and when in electrical contact is electrically separated from the coats of electrically conductive materials (7) on the first and second surfaces by the capacitor material (9a, 9b).

25 Claims, 7 Drawing Sheets

(51) Int. Cl.
  *H01G 4/32*   (2006.01)
  *H01G 11/26*  (2013.01)

(56) References Cited

U.S. PATENT DOCUMENTS

| | | | |
|---|---|---|---|
| 2005/0170599 A1* | 8/2005 | Joo | H01L 28/91 |
| | | | 257/E21.648 |
| 2007/0241424 A1* | 10/2007 | Dalton | H01L 28/91 |
| | | | 257/532 |
| 2011/0019335 A1* | 1/2011 | Wu | H01G 4/005 |
| | | | 361/303 |
| 2013/0037912 A1* | 2/2013 | Sun | H01L 28/55 |
| | | | 257/532 |
| 2018/0033563 A1 | 2/2018 | Phillips | |
| 2018/0158617 A1 | 6/2018 | Carver et al. | |

FOREIGN PATENT DOCUMENTS

| | | | |
|---|---|---|---|
| JP | 64086053 A | 3/1989 | |
| JP | 2006253431 A | 9/2006 | |
| KR | 10-2010-0011128 A | 2/2010 | |
| WO | 2013128082 A1 | 9/2013 | |
| WO | 2018069682 A1 | 4/2018 | |
| WO | 2018174191 A1 | 9/2018 | |

OTHER PUBLICATIONS

Office Action for Japanese Patent Application No. 2021-517197, dated Nov. 29, 2022, 5 pages, Japanese Patent Office.
UKIPO Search Report, dated Mar. 27, 2019, 3 pages.
PCT International Search Report and Written Opinion, dated Jan. 10, 2020, 12 pages.

\* cited by examiner

ENERGY STORAGE DEVICE COMPRISING A GROOVE WITH CAPACITOR MATERIAL THEREIN

The present invention relates to an energy storage device.

BACKGROUND

The efficiency of energy storage in capacitors is dependent on its dielectric material, also known as capacitor or super-capacitor materials. Capacitor materials with a high dielectric constant are able to store high levels of charge per unit volume but are often expensive so must be used efficiently in energy storage devices if the cost of energy storage is to be managed.

One known way of using capacitor or super-capacitor materials efficiently is to use them to provide energy storage devices comprising a substrate with a groove where the groove is filled with the capacitor material, as disclosed in International Patent Publication Number WO2018/069682 and incorporated herein by reference.

However, filling the grooves of a grooved substrate can be difficult to control, depending on the dimensions of the grooves and the properties of the capacitor materials. Consequently, each groove may be under filled, or each groove may be overfilled so that the capacitor material bridges across a plurality of grooves in a substrate.

The presence of capacitor material bridging across a plurality of grooves may improve adhesion of the capacitor material to the substrate and may increase capacitance of the plurality of grooves within the device. However, when overfilled in this way, the increase in capacitance is not substantial as it is only provided by an increased volume of dielectric material.

Further, generally overfilling the grooves in order to bridge across a plurality of grooves risks creating an uneven surface to the capacitor material. Such an uneven surface may result in inefficient packing if the substrate is rolled or layered to form capacitor devices as known in the art.

The present invention aims to mitigate one or more of the disadvantages of existing energy storage devices.

BRIEF SUMMARY OF THE DISCLOSURE

Aspects and embodiments of the invention provide an energy storage device as claimed in the appended claims.

According to an aspect of the invention, there is provided an energy storage device comprising:
a substrate comprising a groove having a first and a second face;
a capacitor material in the groove, the capacitor material having an upper surface;
the first and the second face of the groove each having a coat of non-insulator material;
wherein the coats of non-insulator material on the first and second faces are electrically separated from one another,
and wherein a non-insulating element is configured to be electrically contactable with the upper surface of the capacitor material and when in electrical contact is electrically separated from the coats of non-insulator material on the first and second surfaces by the capacitor material.

In certain embodiments, the coat of non-insulator material on the first and the second faces of the groove are electrically conductive material. More specifically the coat of electrically conductive material may be one or more of: a metal and carbon.

In certain embodiments, at least the coat of electrically conductive material on the first face extends beyond the first face to a first substrate surface portion. In this way, the conductive material on the first face may overlap or be overlapped by conductive material extending from an adjacent groove. As a consequence, the groove may be connected in series with another adjacent groove.

In certain embodiments, the coat of electrically conductive material on the second face extends beyond the second face to a second substrate surface portion. In this way, the conductive material on the second face may overlap or be overlapped by conductive material extending from a further adjacent groove. As a consequence, the groove may be connected in series with one or more adjacent grooves.

Furthermore, by extending the coat of conductive material from either the first face, the second face or the first and second faces to the respective substrate surface portion, the non-insulating element can create capacitance regions with each of the coats of conductive material on the respective substrate surface portions. As a consequence, the spacing between the non-insulating element and each of the coats of conductive material on the respective substrate surface portions may be more accurately controlled. Accurate control of the spacing is important in balancing the voltage breakdown characteristics of the different capacitance regions of the energy storage device.

In certain embodiments, the capacitor material overfills the groove to provide a layer of capacitor material on at least one of the first and second substrate surface portions. In this way, capacitor material that would otherwise increase use of capacitor material but which could only be useful as an adherent between substrate layers may be used to create additional capacitance regions. Furthermore, the thickness of the capacitor material between the non-insulating element and each of the coats of the electrically conductive material may be accurately determined. In other words, the degree to which the capacitor material overfills the groove may at least partly control the separation distance between the non-insulating element and the coats of the electrically conductive material.

In certain embodiments, the capacitor formed by the non-insulating element and capacitor material above the groove forms a first and second portion of the non-insulating element. In this way, the non-insulating element forms two capacitance regions, in addition to the capacitance region located between the first and second faces of the groove thereby providing an energy storage device with significantly increased capacitance for only a small increase in size.

In certain embodiments, the first and second portions of the non-insulating element are electrically connected. In this way, the two capacitance regions formed by the non-insulating element are arranged in series.

In certain embodiments, the first and second faces of the groove are electrically separated by capacitor material of minimum distance 'W'. In this way, the capacitance of the region between the first and second faces of the groove can be determined.

In certain embodiments, the thickness of the capacitor material adjacent each of the first and second portions of the non-insulating element is of thickness X. In this way, the capacitance of the first and second portions can be determined to be substantially the same.

In certain embodiments, X is in the range W/2 to W. In this way, the voltage breakdown characteristics of the capacitance regions between non-insulating element and the coats of electrically conductive material on the surface of the substrate can be balanced with the voltage breakdown characteristics of the capacitance region between the first and second faces of the groove. In other words, it is possible to ensure that none of the capacitance regions break down before the other and it is possible to maintain constant voltage breakdown characteristics for the whole energy storage device.

In certain embodiments, X is minimally W/2. In this way it possible to maintain constant voltage breakdown characteristics for the whole energy storage device.

In certain embodiments, W is in the range 1 to 10 µm. More specifically, W is in the range 2 to 6 µm and yet more specifically, W is 4 µm. In a similar way to that described above, these dimensions ensure optimum charge storage for the groove storage device combined with voltage characteristics for the whole energy storage device.

In certain embodiments, the non-insulating element is printed onto the upper surface of the capacitor material. In this way, the non-insulating element may be easily and accurately located on the capacitor material above the groove.

In certain embodiments, the substrate is in the form of a flexible sheet with upper and lower surfaces and wherein the groove extends along the substrate upper surface and further wherein the non-insulating element extends in the same direction along the lower substrate surface. In this way, the substrate may be easily manufactured as a preform that can be layered with other preforms to form layers of energy storage devices or rolled to form an energy storage device arranged in a space-efficient manner. When the preform is rolled, the non-insulating element on the lower surface of the flexible substrate is brought into contact with the upper surface of the capacitor material above the groove. In this way, the second and third capacitance regions are formed. The energy storage device formed in this way has a reduced risk of short circuits forming within the device. The capacitor material overfilling (overcoating) the grooves will ensure that even with the possibility of some pinhole defects, that the non-insulating element (third conductor) will not contact the first or second conductor (on the first and second faces of the grooves respectively) because it is prevented from doing so by the spacing effect of the capacitor material.

In certain embodiments the groove path may form a zig zag shape as it extends within the grooved layer or may be linear, curved or any other appropriate shape.

In certain embodiments the groove may be from 0.3 to 200 m long, normally from 3 to 300 m long. Each groove is typically greater than 100 m long, optionally greater than 1000 m long, normally greater than 5000 m long and may be greater than 10,000 m long.

In certain embodiments, each groove is typically from 0.3 to 100 µm wide, normally from 0.3 to 10 µm wide. More specifically, the groove is from 1 to 5 µm wide.

In certain embodiments the device comprises a plurality of grooves, the plurality of grooves may be formed into a first and a second series of grooves which may be referred to as cascaded groove structure. In use the device may be fabricated in a series arrangement and operated in a parallel or a combined series and parallel arrangement.

In certain embodiments, the substrate may comprise a patterned region comprising at least one groove or a plurality of grooves electrically connected in parallel with one another.

In certain embodiments, a series of patterned regions are electrically connected with one another to give an effective groove length of up to 100,000,000 m.

In certain embodiments, a secondary capacitor material is provided on the exposed surface of the non-insulating element. In this way, the secondary capacitor material may assist in providing effective electrical contact between the non-insulating element and the surface of the capacitor material when the preforms are layered together or alternatively when the preform is rolled.

In certain embodiments, the non-insulating element is arranged in electrical contact with the upper surface of capacitor material by rolling or winding the substrate sheet. In this way, space-efficient layering may be easily and simply provided from a single substrate sheet. Known roll to roll or roll to sheet processes may be used to roll or wind the substrate in this way.

In certain embodiments, the non-insulating element of a first substrate sheet is located in electrical contact with the upper surface of capacitor material of a second substrate sheet by locating the first substrate sheet on top of the second substrate sheet. In this way, other space-efficient arrangements may be easily provide from multiple substrate sheets.

In certain embodiments, the secondary capacitor material is a gel or liquid of sufficient viscosity that flows to provide intimate contact or seal with the upper surface of the capacitor material. In this way, the secondary capacitor material may be somewhat conformable and, consequently, winding or layering can maximise capacitance, for example by excluding air pockets between layers.

In certain embodiments, the non-insulating element, the coating of the first face and the coating of the second face of the groove are each connected to a charge extraction element. In this way, energy stored in the energy storage device can be effectively extracted for use.

In certain embodiments, the charge extraction elements are electrically separated from each other. In this way, the capacitance regions of the energy storage device will not short circuit each other and charge storage can be maximised.

In certain embodiments, the substrate comprises a series of grooves wherein each groove has a separate non-insulating element. In this way, the capacitance region of adjacent grooves will remain electrically separate and will not short circuit each other.

In certain embodiments the energy storage device comprises a non-polarised capacitor. In this way, the energy storage device can be incorporated into a circuit with an electrical load in any orientation.

According to another aspect of the present invention, there is provided an energy storage device comprising a substrate comprising a groove having a first and a second face, the first and the second faces each having a coat of non-insulating material; a first capacitor material arranged within the groove, wherein the first capacitor material is in electrical contact with and forms a first capacitance region between the coats of non-insulating material on the first and second faces; a second capacitor material having a surface electrically contactable with a non-insulating element and when in contact; the second capacitor material is arranged in electrical contact with and forms a second capacitance region between the non-insulating element and the coat of non-insulating material on either the first or the second face.

In certain embodiments, the second capacitor material is arranged in electrical contact with and forms a third capacitance region between the non-insulating element and the coat of non insulating material on the other of the first or the second face.

In certain embodiments, the non-insulating material is an electrically conductive material.

In certain embodiments, the first capacitor material and the second capacitor material are different.

In certain embodiments, the first capacitor material and the second capacitor material form a single body of capacitor material.

According to another aspect of the invention, there is provided an energy storage device comprising a substrate comprising a groove having a first and a second face, the first and the second faces each having a coat of electrically conductive material;
- a first capacitor material arranged within the groove, wherein the first capacitor material is in electrical contact with and forms a first capacitance region between the coats of electrically conductive materials on the first and second faces;
- a non-insulating element having a first portion and a second portion;
- a second capacitor material wherein the second capacitor material is arranged in electrical contact with and forms a second capacitance region between the first portion of the non-insulating element and the coat of electrically conductive material on the first face;
- a third capacitor material wherein the third capacitor material is arranged in electrical contact with and forms a third capacitance region between the second portion of the non-insulating element and the coat of electrically conductive material on the second face.

BRIEF DESCRIPTION OF THE DRAWINGS

Embodiments of the invention will now be described by way of example only and with reference to the accompanying drawings, in which:

FIGS. 1a and 1b each show a groove 3 and capacitor or supercapacitor material 5 of an energy storage device 1 comprising one or a series of such grooves. The walls of the grooves 3 have a coat of non-insulating material, being metal conductor 7 in the depicted embodiment.

Figure 1A:
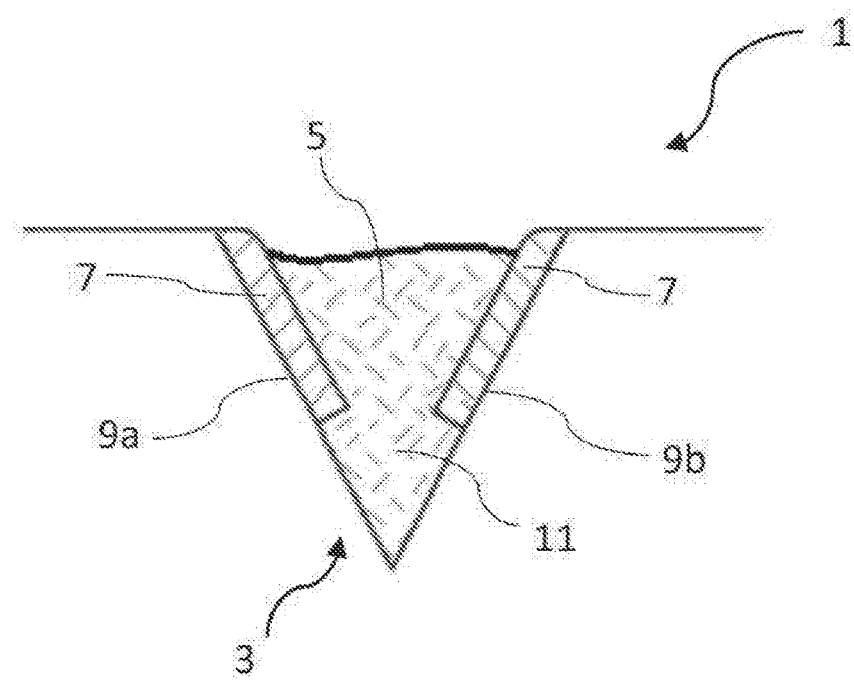
FIG. 1a is a cross-sectional view of a groove of an energy storage device showing partial according to the prior art.

The coat of non-insulating material 7, which in the depicted embodiment is metal, on the first face 9a of the groove 3 is not in electrical contact with the coat of non-insulating material 7, which in the depicted embodiment is metal, on the second face 9b of the groove 3. There is a gap 11 at the bottom of the groove 3 between the coat of metal 7 on the first face 9a of the groove 3 and the coat of metal 7 on the second face 9b of the groove 3. Each coat of metal 7 may also be referred to as a conductor material.

Figure 1B:
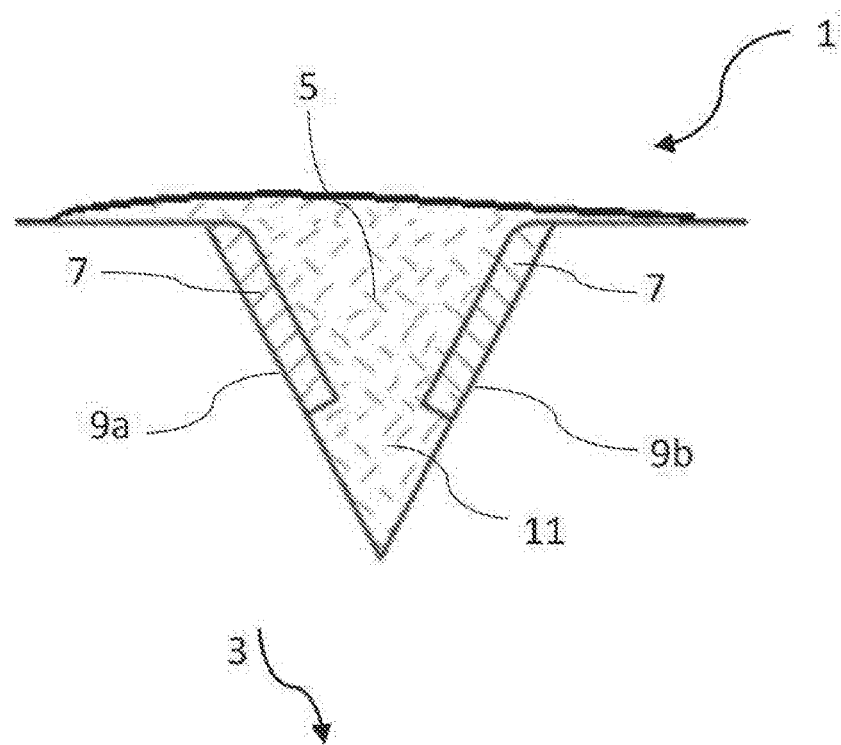
FIG. 1b is a cross-sectional view of a groove of an energy storage device showing overfill fill according to the prior art.

In FIG. 1b the capacitor material 5 overfills the groove 3 so that it extends above the mouth of the groove and laterally beyond the first and second faces 9a and 9b. FIG. 1a shows the same features of an energy storage device but the capacitor/supercapacitor material 5 only partially fills the groove 3.

Figure 2:
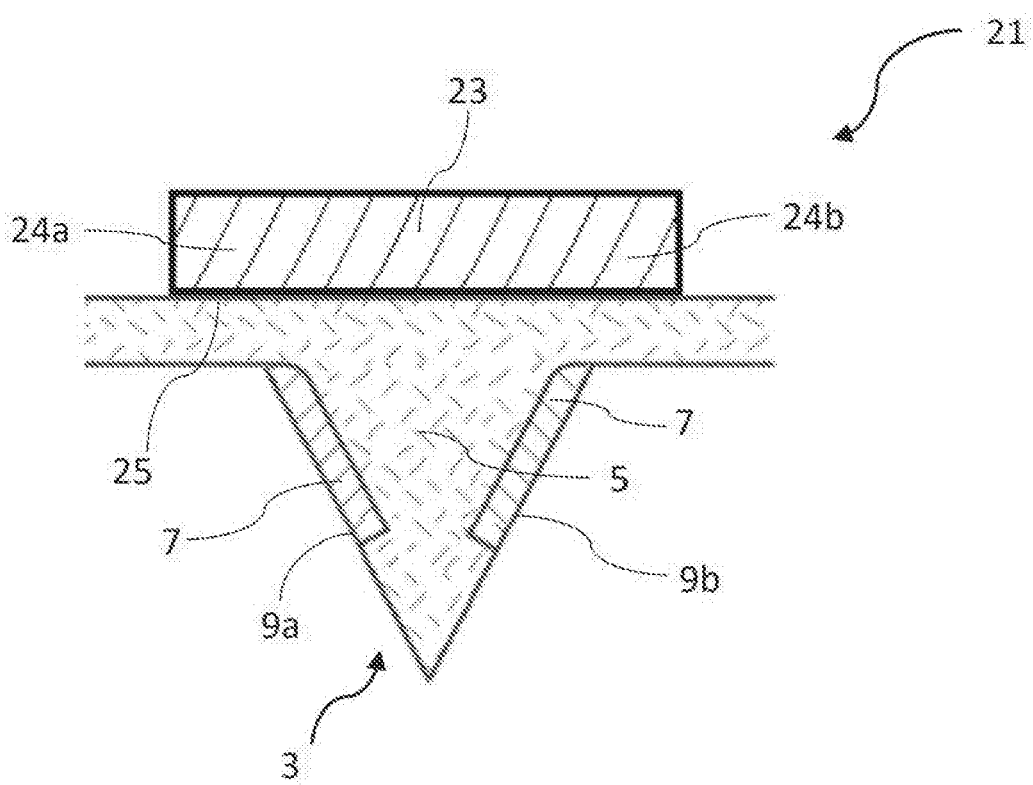
FIG. 2 is a cross-sectional view of an energy storage device according to a first embodiment of the invention.

A first embodiment of the invention is shown in FIG. 2. In a similar manner to FIGS. 1a and 1b, the energy storage device 21 comprises a groove 3 filled with capacitor material 5. The capacitor material 5 forms a first capacitance region in conjunction with the coats of metal 7 on the first and second faces 9a, 9b of the groove 3. In contrast to the prior art devices of FIGS. 1a and 1b, the capacitor material 5 substantially overfills the groove 3 and deliberately extends a desired thickness above the mouth of the groove 3 and forms an upper surface 25.

A non-insulating element 23 is arranged in electrical contact with the upper surface 25. In FIG. 2, the non-insulating element 23 is sufficiently sized so the non-insulating element 23 bridges across and even slightly beyond the mouth of the groove 3.

The non-insulating element 23 is electrically separated from both coats of metal 7 by the capacitor material 5 and is therefore arranged to form a second capacitance region within the capacitor material 5 located between the coat of metal 7 on the first face 9a and a first element portion 24a. In the same way, the arrangement forms a third capacitance region within the capacitor material 5 located between the coat of metal 7 on the second face 9b and a second element portion 24b.

With this arrangement, the capacitor material 5 which fills the groove 3 is utilised more efficiently to provide an energy storage device including more than one capacitance region without requiring significantly more capacitor material 5, or without additional grooves and coats of metal. The additional capacitance is gained with only a small increase in size compared to the energy storage device 1 of the prior art.

Figure 3:
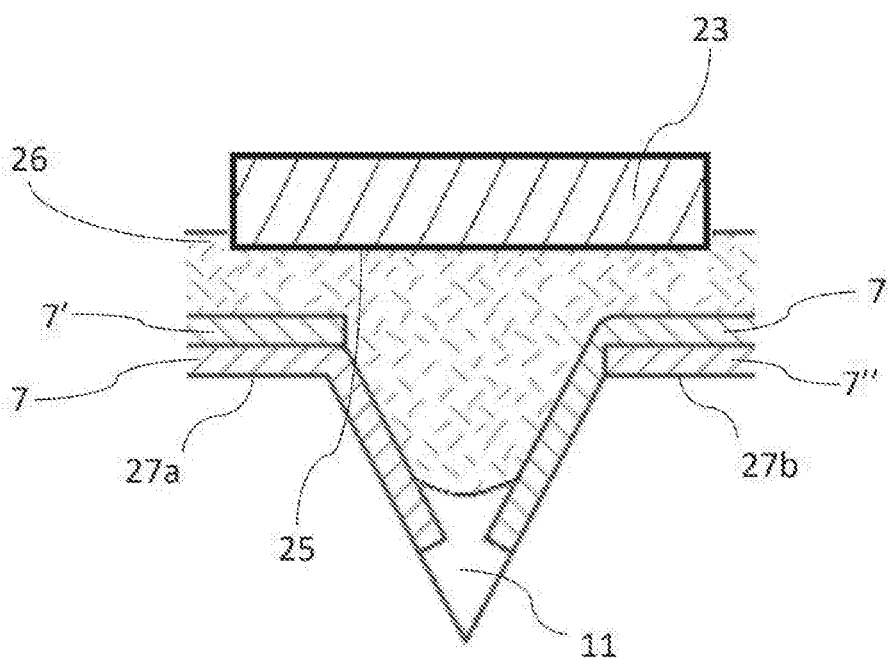
FIG. 3 is a cross-sectional view of an energy storage device according to a second embodiment of the invention.

A further embodiment of the invention is shown in FIG. 3. In this embodiment, the coats of metal 7 extend out of the groove 3 to cover the substrate surface portions 27a, 27b adjacent the mouth of the groove 3. Where one groove is arranged on a substrate to be adjacent to other grooves, the coats of metal 7 may overlap so that grooves are electrically connected in series. In this way, the coat of metal 7 on the first face 9a may overlap, or be overlapped, by a coat of metal 7' of a second groove, while the coat of metal 7 on the second face 9b may overlap, or be overlapped, by a further coat of metal 7" of a third groove.

The arrangement of the non-insulating element 23 above the groove provides parallel capacitance to the capacitance within the groove. It is therefore important to balance the voltage breakdown characteristics of the different capacitance regions in order that the energy storage device has constant voltage breakdown characteristics. If the voltage breakdown on the parallel capacitance is not balanced with the groove capacitance then voltage breakdown in one region would occur before the other region or regions, introducing a weak link or short circuit in the device.

Capacitance of any single capacitance region depends on the spacing of dielectric or capacitor material 5 between electrically separated conductors. In the first and second embodiments of the invention, the capacitance of the groove region of the invention is thus dependent on the distance W of FIG. 4a or 4b, in other words the narrowest spacing of capacitor material electrically separating the first and second coats of metal 7 of groove 3.

Figure 4A:
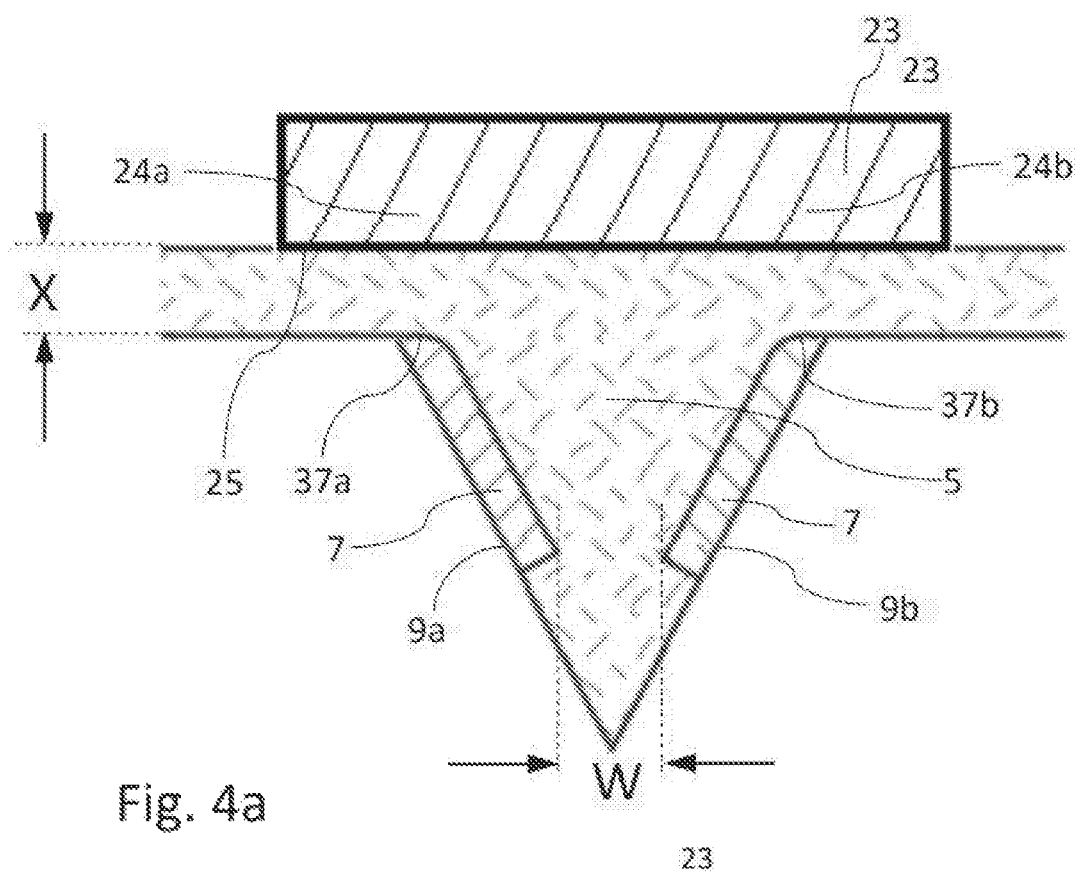
FIG. 4a is a cross-sectional view of the first embodiment showing dimensions W and X.

Therefore, in the embodiment in FIG. 4a, where the groove 3 is completely filled with capacitor material 5, then W is the minimum distance between the coats of metal on faces 9a and 9b. However, in the embodiment in FIG. 4b, the presence of a gap 11 in the capacitor material 5 means that W is the distance between the lowest portions of the coats of metal 7 that contact the capacitor material 5.

In a similar way, by providing a non-insulating element 23 in electrical contact with the upper surface 25 of the capacitor material, the capacitance of each of the parallel capacitance regions is thus dependent on the distance X, namely the minimum thickness of capacitor material 5 between the lower surface of the non-insulating element 23 and the uppermost portion 37a or 37b of the metal coat 7.

Therefore, in the embodiment in FIG. 4a, the capacitance of the second capacitance region has minimum vertical distance X corresponding to the thickness of capacitor material 5 electrically separating the first uppermost portion 37a of the metal coat 7 located at the mouth of the groove 3 and the first element portion 24a. Similarly, the capacitance of the third capacitance region is the minimum vertical distance corresponding to the thickness of capacitor material 5 electrically separating the corresponding portions 37b and 24b.

Figure 4B:
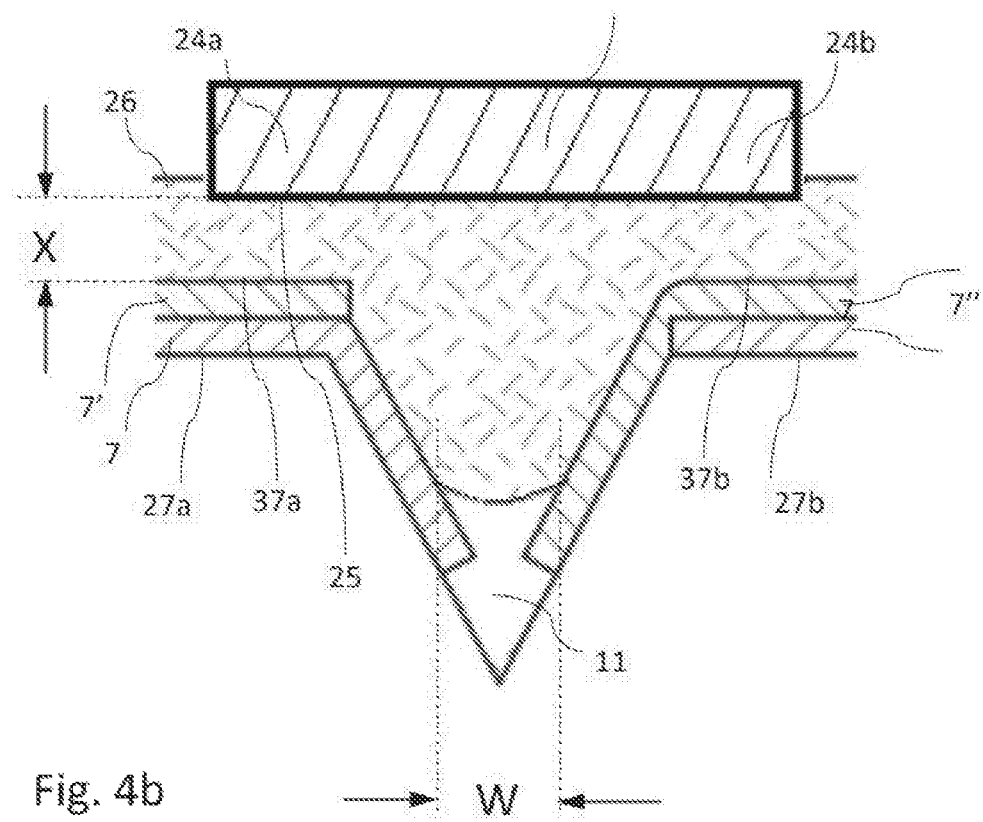
FIG. 4b is a cross-sectional view of the second embodiment showing alternative dimensions W and X.

The same factors apply to the embodiment in FIG. 4b such that the capacitance depends on the minimum vertical distance X. Consequently, any portion of capacitor material 5 that extends around the non-insulating element 23, for example as indicated at 26, is not relevant to determining X. It will be understood that the groove may be any cross-sectional shape, may be symmetrical, or may be an asymmetric V-shape. The groove may be v-shaped, rounded or square.

Figure 9A:
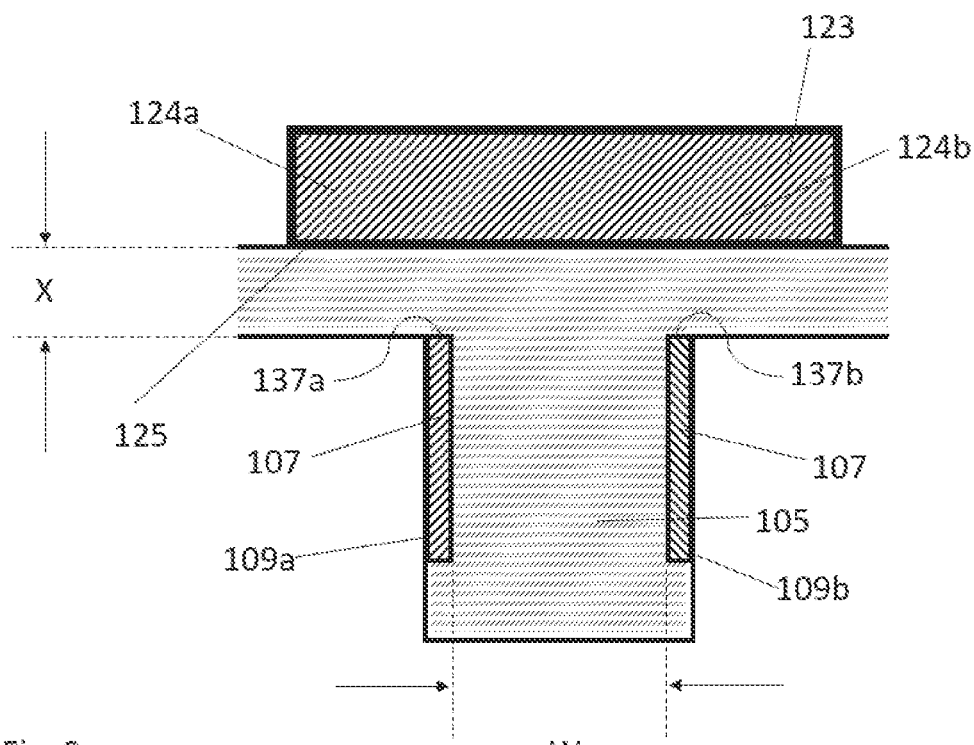
FIG. 9a is a cross-sectional view of the further embodiment of an energy storage device according to the invention and showing dimensions W and X.
Figure 9B:
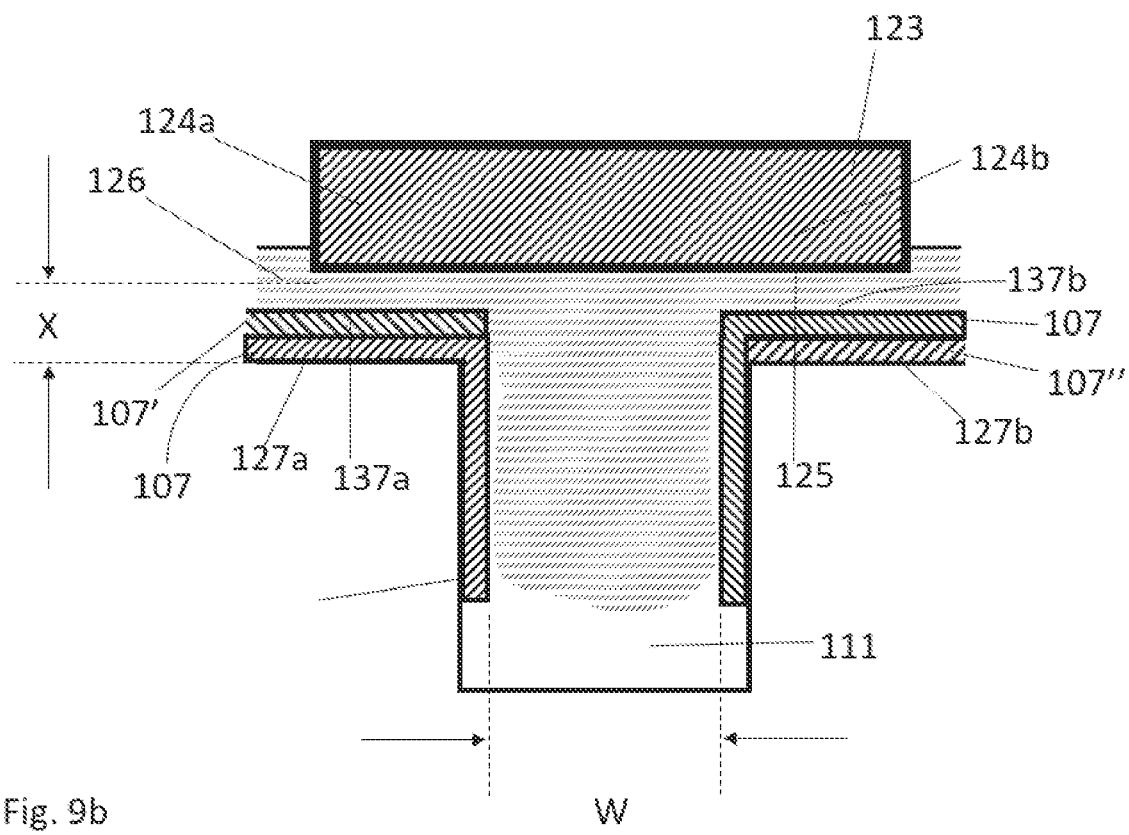
FIG. 9b is a cross-sectional view of the further embodiment of FIG. 9a showing alternative dimensions W and X.

FIGS. 9a and 9b show a groove similar to that shown in FIGS. 4a and 4b with similar features denoted by the same reference numeral increased by a factor of 100. The groove has a square cross-sectional shape. The distance W between the coats of metal 137a and 137b on faces 109a and 109b is consistent throughout the depth of the groove.

In the above arrangements, it has been found that in order to balance the voltage breakdown characteristics of the capacitance regions and optimise the energy storage device then the relationship between X and W should be:

$$X \geq W/2$$

Typical values of W are in the range 1 to 10 μm. More specifically, W is in the range 2 to 6 μm. Even more specifically, W is 4 μm.

In certain embodiments, the first and second faces of the groove are from about 2 to about 20 microns high. That is to say, the empty depth of the groove is from between about 2 to about 20 microns.

The energy storage device of the invention, including the embodiments in FIGS. 2 to 4b comprise any suitable support substrate or web. In an embodiment shown in cut-away form in FIG. 5, the groove 3 of an energy storage device 21 of the invention is arranged within a grooved layer 31, itself arranged on the upper surface of a support layer 29. The support layer 29 and the grooved resin layer 31 together comprise the support substrate or web which extends in the direction of, and for the full length of, the groove 3. As will be apparent, the groove 3 may be one of a plurality of such grooves arranged on a single support substrate or web. In other words, the support layer 29 and grooved resin layer 31 may together extend to either side or both sides of the depicted groove 3 so that additional grooves (not shown) may be provided.

The groove 3 extends in a zig zag path along the grooved resin layer 31. In order to ensure the coating of metal on each of the first and second faces of the groove remain electrically separated during the coating process, in certain embodiments the groove is deeper than it is wide (at the mouth of the groove in the case of a V-shaped groove).

Figure 5:
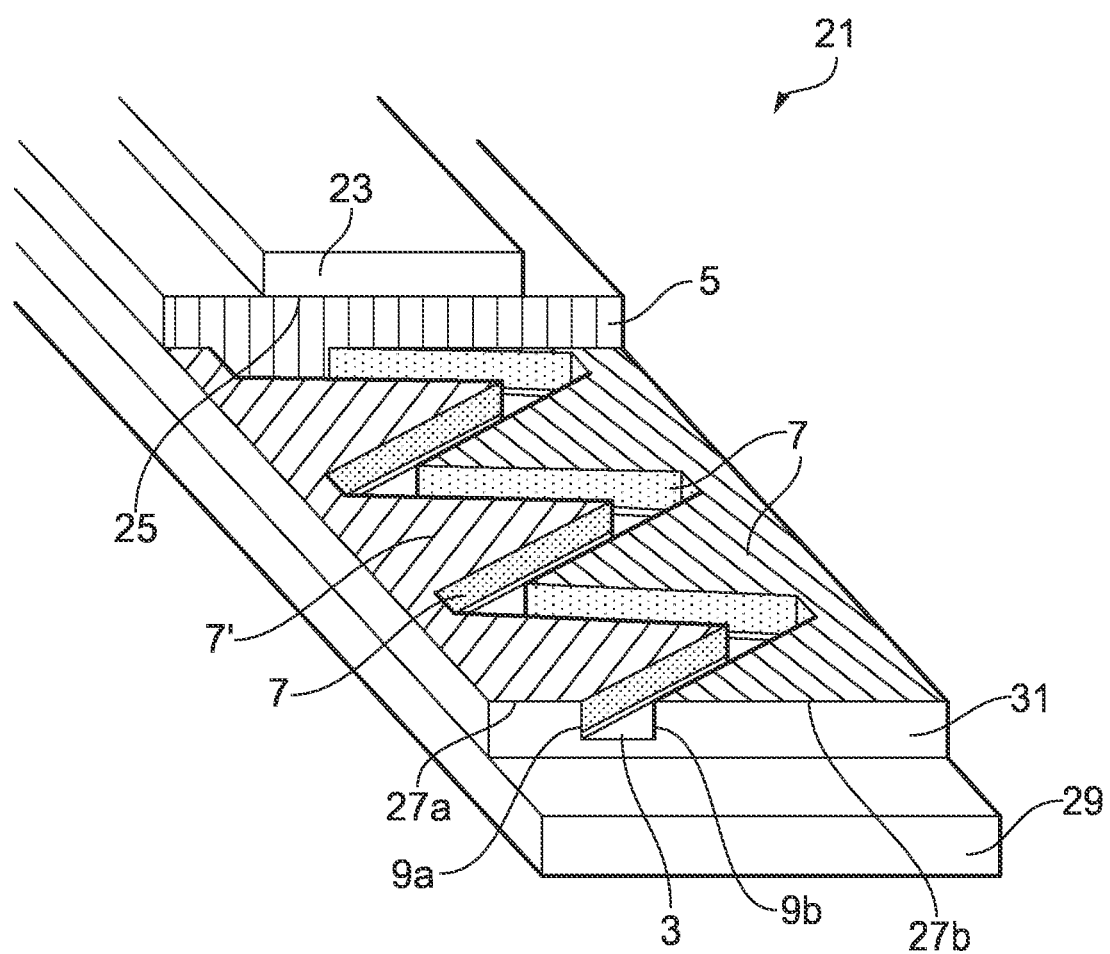
FIG. 5 shows a cut-away view of a portion of an energy storage device according to either the first or second embodiment.

Consistent with the above embodiments, the device 21 of FIG. 5 comprises coats of metal 7 arranged along the first and second faces 9a, 9b of the groove 3 according to known methods. As best seen in the embodiment of FIG. 4b, the coats of metal 7 extend out of the groove 3 and onto substrate surface portions 27a, 27b adjacent to the mouth of the groove 3. The coat of metal 7 formed on substrate surface portion 27b is overlapped by a further coat of metal 7' corresponding to a coat extending from of the groove of an adjacent energy storage device (not shown).

Similar to the above embodiments, the groove 3 of FIG. 5 is filled with capacitor material 5 to form a first capacitance region. The first capacitance region being formed between the non-insulating materials on the first and second faces of the groove 3 and the capacitor material 5 in the groove. The capacitor material 5 extends above the mouth of the groove to an upper surface 25 and extends laterally onto the metal coats 7, 7' arranged on the substrate surface portions 27a, 27b. The groove 3 is therefore overfilled with capacitor material. A non-insulating element 23 is arranged in contact with the upper surface 25 of the capacitor material 5, and is electrically separated from each of the metal coats 7, 7' by the capacitor material 5, thereby forming second and third capacitance regions.

The non-insulating element 23 may be arranged to extend beyond the width of the mouth of the groove 3 far enough to cover, in a single span, the full width of the zig zag path within the grooved resin layer 31. In this way, the non-insulating element 23 may be a simple shape and does not have to match precisely the path of the groove 3. Alternatively, the non-insulating element 23 may match the path of the groove 3, if required. Further alternatively, and as shown in FIG. 5, the non-insulating element 23 may by narrower than the overall width of the groove 3 and may span only a portion of the overall width that the groove path makes in the grooved resin layer 31.

As mentioned above, it is envisaged that a grooved resin layer 31 may comprise a plurality of grooves arranged side by side. In this arrangement, the coats of metal from one groove may overlap with coats of metal from adjacent grooves so that the first capacitance regions of the adjacent energy storage devices are arranged in series.

With a series of first capacitance regions so arranged, each groove has a unique non-insulating element 23, electrically separated from adjacent non-insulating elements. In this way, each non-insulating element 23 will provide unique second and third capacitance regions arranged in parallel with its first capacitance region.

Figure 6:
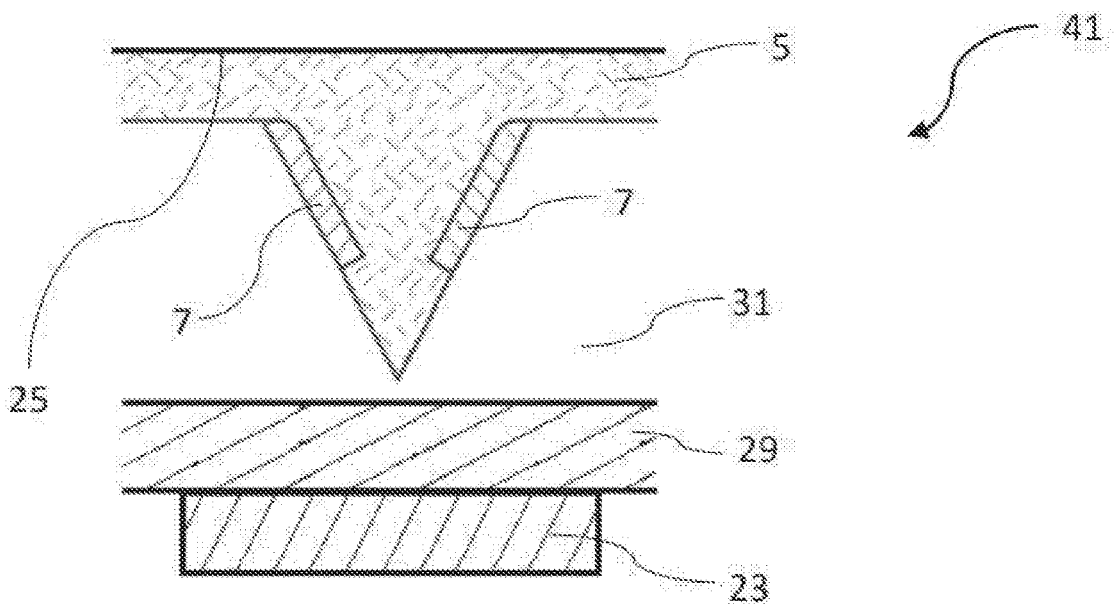
FIG. 6 is a cross-sectional view of an embodiment of a preform for an energy storage device according to the invention comprising a support substrate prior to rolling or layering with other preforms.

In a further embodiment, shown in FIG. 6, a preform 41 for an energy storage device according to the invention is provided. In the preform 41, the non-insulating element 23 is arranged on the lower surface of the support layer 29, although the other features are otherwise the same as shown in any embodiment described with reference to FIGS. 2-5. In order to form the second and third capacitance regions, the substrate 29 is rolled in order to bring the non-insulating element 23 in contact with the upper surface of capacitor material 5 which overfills groove 3.

In embodiments not shown, the preform for an energy storage device according to the invention 41 may comprise a series of grooves arranged side by side on a single support substrate.

Figure 7:
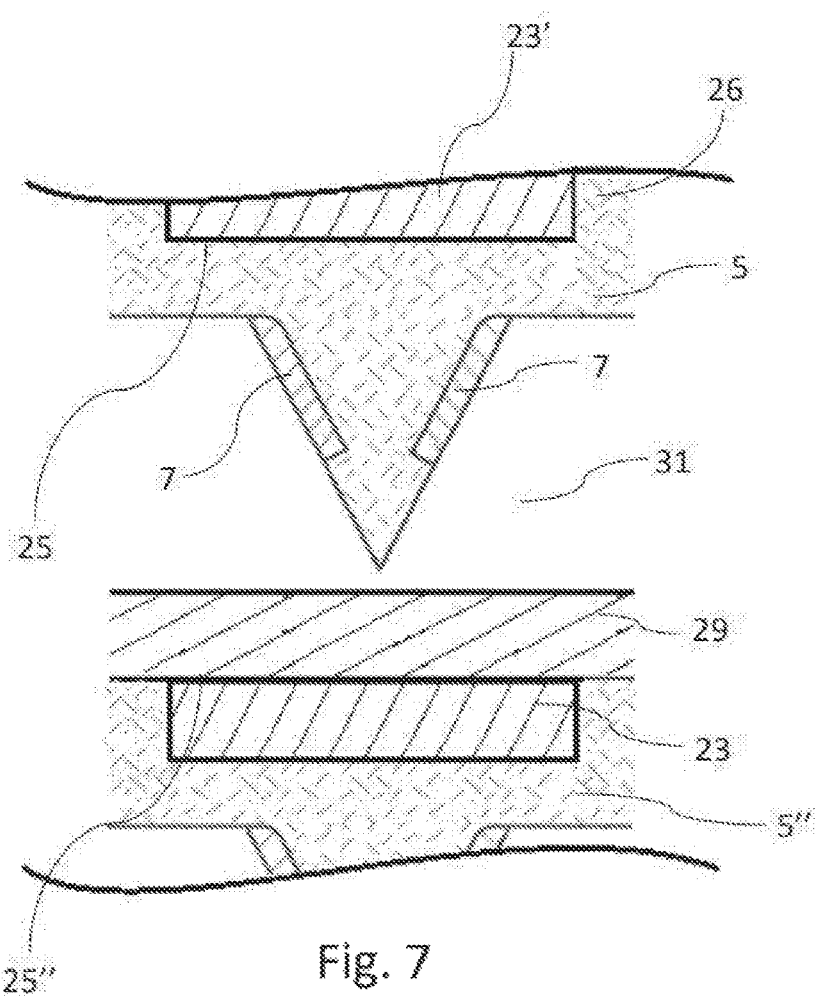
FIG. 7 is a cross-sectional view of the preform for an energy storage device according to the invention of FIG. 6 when layered with other preforms.

In alternative embodiments depicted in FIG. 7, in order to form an energy storage device, a first preform 41 is arranged on a second, identical preform such that the non-insulating element 23 of the first preform contacts the upper surface 25" of the capacitor material 5" above a groove of the second preform.

In embodiments not shown, a third, also identical, preform arranged on the first preform such that the non-insulating element 23' of the third preform contacts the upper surface 25 of the capacitor material 5 above a groove of the first preform.

Further embodiments not shown may be formed by arranging additional layers of preforms 41 on the second and third preforms. The layers may be provided by any appropriate means, for example by arranging independent support substrates or webs, each comprising one or a series or preforms, on top of one another, or by winding or rolling a single support substrate comprising a series of preforms around itself.

Optionally, the non-insulating element 23 of the preform 41 may be coated with secondary capacitor material in order to ensure an effective contact when brought into contact with the capacitor material of a groove. Similarly, the non-insulating element 23 of the other embodiments may also be coated with secondary capacitor material for the same reason. In either case, the contact between non-insulating element 23 and capacitor material may be particularly effective if the capacitor material 5, the secondary capacitor material, or both, are in gel form or a liquid of suitable viscosity. Thus, assembly of an energy storage device 21, or layering, winding or rolling of preforms 41 would allow for the conformability of the dielectric to create an intimate contact or seal between the two capacitor material layers excluding air pockets and maximising the capacitance obtained.

In the embodiments shown in FIGS. 1-7, and in FIGS. 9a and 9b, the capacitors of the energy storage device use a single mass of capacitor material 5 which forms discrete capacitors in the regions between coats of metal on the faces of the groove and between the coats of metal on the surface of the substrate and the non-insulating element 23. Other arrangements comprising two or more discrete, electrically-separated capacitor materials may also be employed and remain within the scope of the invention.

Figure 8:
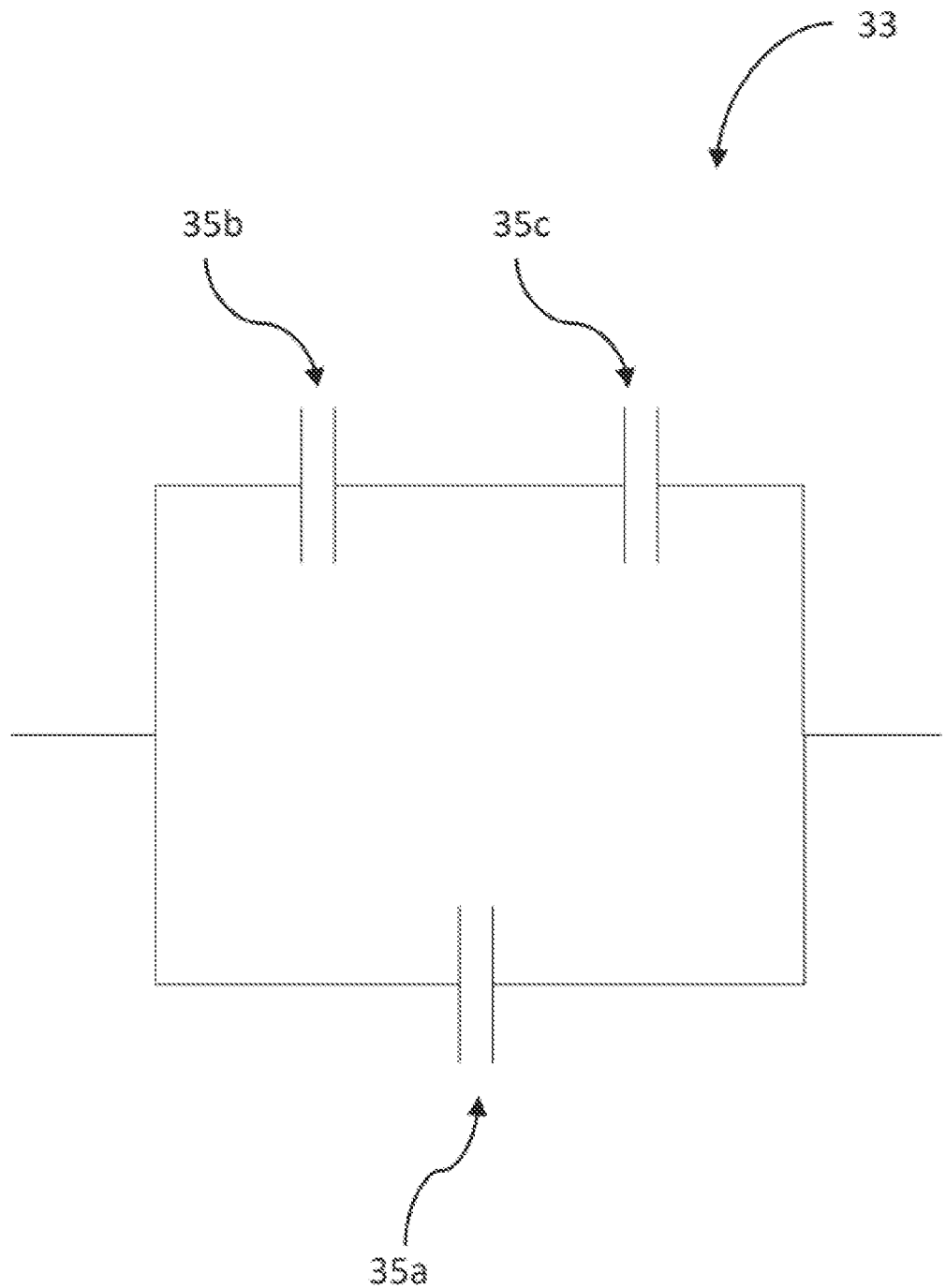
FIG. 8 shows a circuit diagram of the energy storage device of any of FIGS. 2-5 and FIGS. 9a and 9b and formable when the preform of FIG. 6 is rolled.

FIG. 8 is an electrical circuit diagram 33 of the energy storage device 21 of the present invention. The circuit diagram 33 shows capacitors 35a, 35b and 35c. Typically, the energy storage devices of the invention apply the electrical load across a first capacitor 35a created in the first capacitance region. In this arrangement, the first capacitor 35a comprises the capacitor material 5 in conjunction with both of the metal coats 7 on the first and second faces of the groove, and is arranged in parallel to the other two capacitors 35b, 35c. The second capacitor 35b and third capacitor 35c, correspond to the second and third capacitance regions and separately comprise capacitor material 5 in conjunction with one of the metal coats 7 on the first and second substrate surface portions and the non-insulating element 23.

It will be understood that the above description of specific embodiments is by way of example only and is not intended to limit the scope of the present disclosure. Many modifications are envisaged and intended to be within the scope of the present disclosure.

The coats of metal 7 may be an electrical conductor. The coats of metal 7 may comprise one or more of aluminium, bismuth, cadmium, chromium, copper, gallium, gold, indium, lead, magnesium, manganese, samarium, scandium, silver, tin, zinc, terbium, selenium, molybdenum, yttrium, holmium, calcium, nickel, tungsten, platinum, palladium and vanadium. In alternative embodiments, the coats of non-insulating material may be carbon instead of metal.

The grooved layer may comprise a curable resin and in particular a UV curable resin. The support layer may comprise a polymer. Together, the support substrate or web may comprise one or more of an acrylic resin coated onto polyvinyl chloride (PVC), acrylic resin coated onto polyethylene terephthalate (PET), acrylic resin coated onto polyethylene naphthalate (PEN), a biopolymer coated onto polyvinyl chloride (PVC), a biopolymer coated onto polyethylene terephthalate (PET) and a biopolymer coated onto polyethylene naphthalate (PEN).

The capacitor material may be a super-capacitor material. The capacitor may be and/or may be referred to as a dielectric or insulator material. The insulator is typically an electrical insulator material.

The capacitor material may be formed of one or more of the following materials: metal/mixed metal oxides (e.g. Aluminium oxide, Titanium dioxide, Barium titanate, Zinc magnesium titanate, Zinc strontium titanate, Niobium pentoxide, Lead Zirconium Titanate, Tantalum pentoxide, Zinc niobium oxide, Magnesium niobium oxide, Zinc tantalum oxide, Magnesium tantalum oxide, Barium titanate, Barium strontium titanate); organic polymers (e.g. Polypropylene, Polyethylene terephthalate, Poly(vinylidene fluoride), and copolymers of vinylidene fluoride with one or more of: Chlorotrifluoroethylene, Trifluoroethylene, Hexafluoropropylene, chlorofluoroethylene); Cellulose, and cellulose derivatives such as, for example, Cellulose acetate, diacetate or triacetate, Alkylsilyl cellulose, Cyanoalkylated or alkylated cellulose.

The capacitor material may comprise composites of any of the polymers listed above with particles of one or more of the metal oxides listed above of size 5 nm-1 μm.

The capacitor material may comprise composites of any of the polymers listed above with nanoparticles of one or more of the metal oxides listed above. In certain embodiments the capacitor material comprises a salt solution, where the salt is one or more of: Sodium chloride, Potassium chloride, Potassium hydroxide, an alkylammonium or alkylimidazolium tetrafluoroborate, an alkylammonium or alkylimidazolium bis(trifluoromethylsulfonyl)imide, an alkylammonium or alkylimidazolium trifluoromethanesulfonate, an alkylammonium or alkylimidazolium hexafluorophosphate, and a salt of sulphuric acid or adipic acid. Other suitable salt solutions may be used in certain embodiments of the invention.

The capacitor material may comprise a ionic (salt of other material in solution) solution in an insulating scaffold, where the salt is one or more of: Sodium chloride, Potassium chloride, an alkylammonium or alkylimidazolium tetrafluoroborate, an alkylammonium or alkylimidazolium bis(trifluoromethylsulfonyl)imide, an alkylammonium or alkylimidazolium trifluoromethanesulfonate, an alkylammonium or alkylimidazolium hexafluorophosphate, sulphuric acid or adipic acid. In certain embodiments the scaffold may be formed from: insulating nanoparticles (e.g. silicon oxide); high dielectric nanoparticles; porous polymers; or any insulating medium that accepts the ionic solution. In such embodiments the ionic solution is preferably in the form of a gel or a liquid of suitable viscosity. in order that the non-insulating electrode can be supported on the upper surface of the capacitor material.

The salt solution may comprise one or more of the following solvents: water, acetonitrile, propylene carbonate, ethylene carbonate, gamma butyrolactone, ethylene glycol and propylene glycol; and/or one or more of the following polymers: polyethylene oxide, polyacrylonitrile, polymethylmethacrylate, poly(vinyl alcohol). In such embodiments the salt solution is preferably in the form of a gel or a liquid of suitable viscosity. in order that the non-insulating electrode can be supported on the upper surface of the capacitor material.

A groove may be any cross-sectional shape, may be symmetrical, or may be an asymmetric V-shape. The groove may be v-shaped, rounded or square.

The first face of the groove may be longer than the second face of the groove or the second face of the groove may be longer than the first face of the groove.

The first face of the groove may be at a first angle relative to a normal from the support layer 29 and the second face of the groove is at a second angle relative to the normal from the substrate, the first and second angles are from 25° to less than or equal to 90°. The first and second angles may be different.

The groove path may form a zig zag shape as it extends within the grooved layer or may be linear, curved or any other appropriate shape.

A groove may be from 0.3 to 200 m long, normally from 3 to 300 m long. Each groove is typically greater than 100 m long, optionally greater than 1000 m long, normally greater than 5000 m long and may be greater than 10,000 m long. Each groove is typically from 0.3 to 100 μm wide, normally from 0.3 to 10 μm wide. More specifically, the groove is from 1 to 5 μm wide.

In certain embodiments, each groove or parallel electrically connected series of grooves may have an effective length of up to 100,000,000 m.

Up and down, upper and lower, and other relative directional terms are to be determined accordingly unless otherwise stated.

The invention claimed is:

1. An energy storage device comprising:
   a substrate comprising a groove having a first and a second face;
   a capacitor material in the groove, the capacitor material having an upper surface;
   the first and the second face of the groove each having a coat of non-insulator material;
   wherein the coats of non-insulator material on the first and second faces are electrically separated from one another,
   wherein a non-insulating element is configured to be electrically contactable with the upper surface of the capacitor material and when in electrical contact is electrically separated from the coats of non-insulator material on the first and second surfaces by the capacitor material; and
   wherein the substrate is in the form of a flexible sheet with upper and lower surfaces and wherein the groove extends along the substrate upper surface and further wherein the non-insulating element extends in the same direction along the lower substrate surface.

2. An energy storage device according to claim 1, wherein the coats of non-insulator material on the first and the second face of the groove are electrically conductive material.

3. An energy storage device according to claim 2, wherein at least the coat of electrically conductive material on the first face extends beyond the first face to a first substrate surface portion.

4. An energy storage device according to claim 3, wherein the coat of electrically conductive material on the second face extends beyond the second face to a second substrate surface portion.

5. An energy storage device according to claim 3, wherein the capacitor material overfills the groove to provide a layer of capacitor material on at least one of the first and second substrate surface portions.

6. An energy storage device according to claim 1, wherein the capacitor formed by the non-insulating element and capacitor material above the groove forms a first and second portion of the non-insulating element.

7. An energy storage device according to claim 6, wherein the first and second portions of the non-insulating element are electrically connected.

8. An energy storage device according to claim 1, wherein the first and second faces are electrically separated by capacitor material of minimum distance W.

9. An energy storage device according to claim 8, wherein the capacitor material adjacent each of the first and second portions of the non-insulating element is of thickness X.

10. An energy storage device according to claim 9 wherein X is in the range W/2 to W.

11. An energy storage device according to claim 8, wherein W is in the range 1 to 10 μm.

12. An energy storage device according to claim 1, wherein the non-insulating element is printed onto the upper surface of the capacitor material.

13. An energy storage device according to claim 1, wherein a secondary capacitor material is provided on an exposed surface of the non-insulating element.

14. An energy storage device according to claim 13, wherein the secondary capacitor material is a gel or liquid that flows to provide intimate contact or seal with the upper surface of the capacitor material.

15. An energy storage device according to claim 1, wherein the non-insulating element is arranged in electrical contact with the upper surface of capacitor material by rolling or winding the substrate sheet.

16. An energy storage device according to claim 1, wherein a non-insulating element of a first substrate sheet is located in electrical contact with an upper surface of capacitor material of a second substrate sheet by locating the first substrate sheet on top of the second substrate sheet.

17. An energy storage device according to claim 1, wherein the non-insulating element, the coating of the first face and the coating of the second face are each connected to a charge extraction element.

18. An energy storage device according to claim 17, wherein the charge extraction elements are electrically separated from each other.

19. An energy storage device according to claim 1, wherein the substrate comprises a support layer and a grooved layer and wherein the groove is entirely formed in the grooved layer.

20. An energy storage device according to claim 1, wherein the substrate comprises a series of grooves wherein each groove has a separate non-insulating element.

21. An energy storage device comprising:
   a substrate comprising a groove having a first and a second face, the first and the second faces each having a coat of non-insulating material;
   a first capacitor material arranged within the groove, wherein the first capacitor material is in electrical contact with and forms a first capacitance region between the coats of non-insulating material on the first and second faces;
   a second capacitor material having a surface electrically contactable with a non-insulating element and when in contact;
   the second capacitor material is arranged in electrical contact with and forms a second capacitance region between the non-insulating element and the coat of non-insulting material on either the first or the second face; and
   wherein the substrate is in the form of a flexible sheet with upper and lower surfaces and wherein the groove extends along the substrate upper surface and further wherein the non-insulating element extends in the same direction along the lower substrate surface.

22. An energy storage device according to claim 21, wherein the non-insulating material is an electrically conductive material.

23. An energy storage device according to claim 22, wherein the first capacitor material and the second capacitor material are different.

24. An energy storage device according to claim 22, wherein the first capacitor material and the second capacitor material form a single body of capacitor material.

25. An energy storage device comprising:
   a substrate comprising a groove having a first and a second face, the first and the second faces each having a coat of non-insulating material;
   a first capacitor material arranged within the groove, wherein the first capacitor material is in electrical contact with and forms a first capacitance region between the coats of non-insulating material on the first and second faces;
   a non-insulating element having a first portion and a second portion;
   a second capacitor material wherein the second capacitor material is arranged in electrical contact with and forms a second capacitance region between the first portion of the non-insulating element and the coat of non-insulating material on the first face;
   a third capacitor material wherein the third capacitor material is arranged in electrical contact with and forms a third capacitance region between the second portion of the non-insulating element and the coat of non-insulating material on the second face; and
   wherein the substrate is in the form of a flexible sheet with upper and lower surfaces and wherein the groove extends along the substrate upper surface and further wherein the non-insulating element extends in the same direction along the lower substrate surface.

* * * * *